United States Patent
Suzuki et al.

(10) Patent No.: US 6,869,737 B2
(45) Date of Patent: Mar. 22, 2005

(54) METHOD FOR EXPOSING A PHOTOSENSITIVE RESIST LAYER WITH NEAR-FIELD LIGHT

(75) Inventors: Keiji Suzuki, Kanagawa-ken (JP); Hideki Ookawa, Kanagawa-ken (JP); Junichi Tonotani, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/768,129

(22) Filed: Feb. 2, 2004

(65) Prior Publication Data

US 2004/0152323 A1 Aug. 5, 2004

(30) Foreign Application Priority Data

Feb. 3, 2003 (JP) .......................... 2003-026399
Aug. 5, 2003 (JP) .......................... 2003-206104

(51) Int. Cl.⁷ .......................... G03F 9/00; H01L 21/302
(52) U.S. Cl. .......................... 430/5; 438/689; 438/942; 134/1.3
(58) Field of Search .................. 430/5; 134/1.3; 438/689, 942

(56) References Cited

U.S. PATENT DOCUMENTS 6,720,115 B2 * 4/2004 Inao et al. .................. 430/5

FOREIGN PATENT DOCUMENTS

EP  0 418 427 A2   3/1991
JP  60-158450   *   8/1985
JP  3-209479 A      9/1991

OTHER PUBLICATIONS

"A Novel Fabrication Technology For Smooth 3D Inclined Polymer Microstructures With Adjustable Angles"; Hung et. al.; (2003'); Transducers '03, International Conference On Solid State Sensors, Actuators and Microsystems, abstract only.*

J. Goodberlet et al., "Patterning Sub–50 nm Features with Near–Field Embedded–Amplitude Masks", Applied Physics Letters, vol. 81, No. 7, Aug. 12, 2002, pp. 1315 and 1317.

M.M. Alkaisi et al., "Optical Near Field Nanolithography", AAPPS Bulletin vol. 11, No. 3, 2001, p. 10–14.

* cited by examiner

Primary Examiner—George A. Goudreau
(74) Attorney, Agent, or Firm—Foley & Lardner LLP

(57) ABSTRACT

In a method for exposing a photosensitive resist layer with near-field light, a liquid film layer is provided between the photosensitive resist layer and a photomask. The photomask has a light-shielding film containing an opening portion through which a propagated light emitted from a light source cannot pass. The photosensitive resist layer is exposed with near-field light through the opening portion and the liquid film layer.

28 Claims, 6 Drawing Sheets

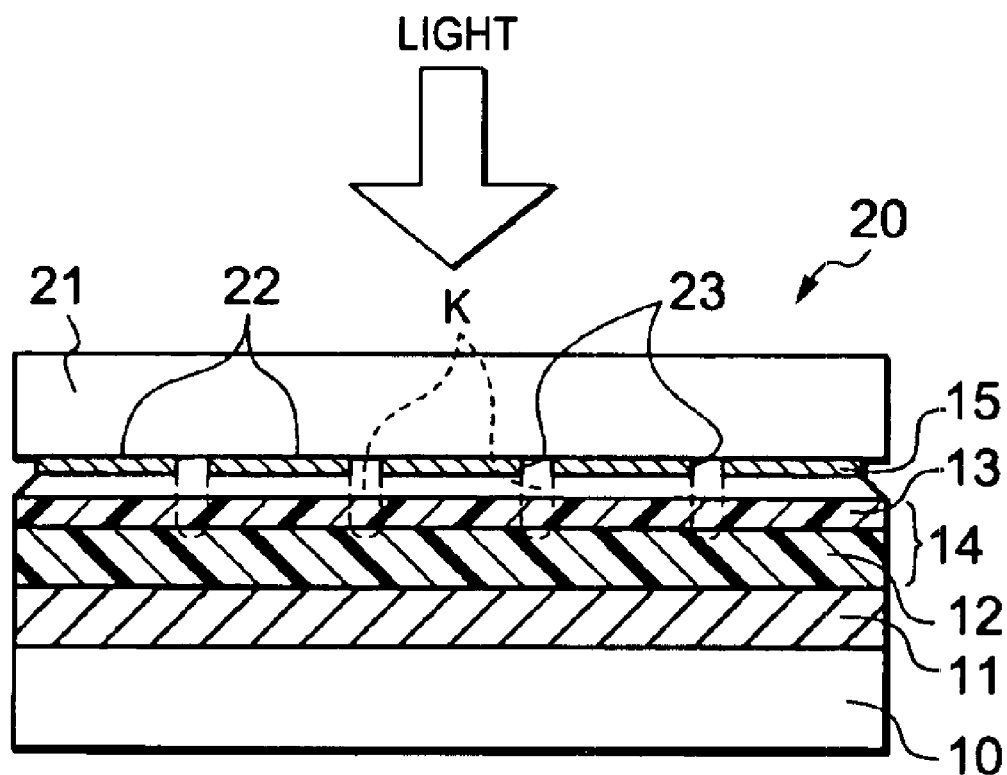

METHOD FOR EXPOSING A PHOTOSENSITIVE RESIST LAYER WITH NEAR-FIELD LIGHT

CROSS REFERENCE TO RELATED APPLICATION

This application is based upon and claims the benefit of priorities from the prior Japanese Patent Applications No. 2003-26399 filed on Feb. 3, 2003 and No. 2003-206104 filed on Aug. 5, 2003; the entire contents of which are incorporated herein by reference.

FIELD OF THE INVENTION

The present invention relates to a method for exposing a photosensitive resist layer with near-field light. The invention further relates to a method for manufacturing semiconductor devices including a step of exposing a photosensitive resist layer with near-field light.

DISCRIPTION OF THE BACKGROUND

In producing semiconductor devices or liquid-crystal display devices, photolithography is used to form circuit patterns on semiconductor wafers or glass substrates.

Photolithography has an exposure step for irradiating a photosensitive resist layer formed on the substrate to transfer the circuit patterns formed on a photomask to the photosensitive resist layer.

In order to expose finely, it is necessary to form fine patterns by the use of photolithography as recent development of enlarging in semiconductor memories and of speeding up in CPU processors.

The limit of the fineness of exposure depends on a spot size of light focused by lenses. A mathematical model 1 (the Rayleigh equation), which is shown below, expresses the spot size.

(Mathematical model 1)

$$\phi = k1 \times (\lambda/NA)$$

The reference codes cited in mathematical model 1 are shown below.

φ: a spot size;
□: a wavelength of light;
NA: a numerical aperture of an objective lens;
K1: a proportional constant of an optical system.

According to mathematical model 1, shortening wavelength λ or enlarging numerical aperture NA reduce spot size □.

When a short-wavelength laser as a light source, such as $A_rF$ eximer laser (193 nm) or $F_2$ laser (152 nm) is used, it is necessary to vacuumize the optical system including an optical path to pass the light. Such a short-wavelength light may restrict materials of an objective lens.

In Fluorine ($F_2$) laser, for instance, fluorspar ($CaF_2$), which is transparent to the short-wavelength, can be used as an objective lens.

Shortening of wavelength □ causes the problems in minimizing spot size φ as described above.

Enlarging of numerical aperture NA decreases a focal point depth according to a mathematical model 2 shown below.

Decreasing of the focal point depth causes a difficulty in forming fine patterns when a surface of exposed substrates is uneven.

(Mathematical model 2)

$$DOF = k2 \times (\lambda/NA^2)$$

The reference codes cited in mathematical model 2 are shown below.

DOF: a focal point depth;
λ: a wavelength of light;
NA: a numerical aperture of an objective lens;
k2: a proportional constant of an optical system.

For the purpose of enhancing a resolution limit which depends on wavelength λ and numerical aperture NA, a phase-shift mask is used. The phase-shift mask is a mask having a lattice-like pattern on a mask substrate and phase shifters made of halftone films.

When a phase-shift mask is irradiated with light, phase of the light which transmits the phase shifter shifts a 180-degree. Thus, two kinds of lights, one of which transmits the phase shifter and the other of which transmits a portion adjacent to the phase shifter, offset each other in appearance.

Consequently, light contrast is improved and enables exposure with an accuracy of approximately 50 nm by the use of $F_2$ laser.

But, the use of a phase-shift mask requires high cost exposure equipment such as a stepper, and hence is expensive.

Recently, an exposure method using near-field light is paid attention to. A principle of generation of near-field light is explained below with reference to FIG. 3.

Many electric dipoles arise in a number of atoms of a material by irradiating the material to light. Each pole of the electric dipoles vibrates each other. As shown in FIG. 3, two electric flux lines E1 and E2 arise around a single electric dipole. Electric flux line E1 of the two is a closed curved line. The other electric flux line E2 of the two is a closed curved line connecting two poles of the electric dipole.

Flux E1 is propagated and diffracted as propagated light toward remote field.

Hence, propagated light which is usually observed, is caused by flux E1.

Flux E2 is not propagated to a remote field but is localized at the vicinity of the atom as near-field light.

Thus, near-field light cannot be observed usually.

An exposing process of a photosensitive resist layer, by the use of near-field light, is explained below with reference to FIG. 4.

In exposing a photosensitive resist layer by near-field light, a light-shielding film 104 of a photomask 103 contacts with the photosensitive resist layer 102 formed on the surface of a substrate 101. Then, photomask 103 is irradiated with light through mask substrate 105.

Near-field light arises inside an opening portion 106, which is formed in light-shielding firm 106 for the purpose of exposure.

A part of the near-field light is oozed from opening portion 106 to resist layer 102. Thereby, resist layer 102 is exposed.

The photolithography using near-field light as described above is so-called near-field light lithography.

It is necessary to control polarization of light irradiated to photomask 103 according to the shape of opening portion 106 in the near-field light lithography.

When the shape of opening portion 106 is slit-like, for instance, the irradiated light is polarized in the manner that the electric field of the light is parallel with the slit to transfer the shape of the slit to resist 102.

Since near-field light generates regardless of the dimension of opening portion 106, the near-field light lithography makes it possible to expose finely by miniaturizing the dimension of opening portion 106.

But, near-field light K is oozed only a little to resist layer 102 because near-field light K is localized around the atoms as described above.

Hence, it is necessary to shorten the distance between photomask 103 and resist layer 102.

As shown in FIG. 5, a solid layer 107, on which light-shielding film 104 is formed, directly contacts with resist layer 102 formed on photomask 101. Solid layer 107 serves as a spacer.

The art of FIG. 5 is disclosed in the literature "APPLIED PHYSICS LETTERS Vol 81, No7, 12 Aug. 2002 p.1315".

As shown in FIGS. 6A and 6B, photomask 103 is arranged above the surface of resist layer 102 formed on substrate 101. The space between photomask 103 and layer 102 is vacuumed to enforce the contact strength between photomask 103 and layer 102. The arts of FIGS. 6A and 6B are disclosed in the literature "AAPPS Bulletin Vol. 11, No3 Sep. 2001 p. 10".

But, direct contact of the photomask with a photosensitive resist layer as shown in FIG. 5, causes a problem that the photomask and the layer rub each other in the contacting. As a result, the photomask and the resist layer are damaged.

In particular, when a photomask is an original plate which is manufactured with precision and is used for a long time, it is desired to prevent the photo mask from being damaged.

SUMMARY OF THE INVENTION

According to an aspect of the present invention, a method for exposing a photosensitive resist layer with near-field light, which comprises, providing a liquid film layer between the photosensitive resist layer and a photomask, the photomask having a light-shielding film containing an opening portion whose dimension is smaller than the wavelength of light emitted from a light source, and exposing the photosensitive resist layer with near-field light through the opening portion and the liquid film layer.

According to another aspect of the present invention, a method for exposing a photosensitive resist layer with near-field light, which comprises, providing a liquid film layer between the photosensitive resist layer and a photomask, the photomask having a light-shielding film containing an opening portion through which a propagated light emitted from a light source cannot pass, and exposing the photosensitive resist layer with near-field light through the opening portion and the liquid film layer.

BRIEF DESCRIPTION OF THE DRAWINGS

FIG. 2 is an explanatory drawing showing a principle of an exposure method of the first embodiment in accordance with the present invention.

DETAILED DESCRIPTION OF THE INVENTION

A first embodiment in accordance with the present invention will be explained below with reference from FIGS. 1 to 2.

FIGS. 1A to 1F show successive steps of a method for manufacturing semiconductor devices of the first embodiment in accordance with the present invention. FIG. 2 is an explanatory view showing a principle of a method of exposing in accordance with the present invention.

Figure 1A:
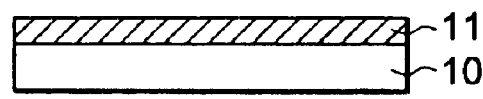
FIGS. 1A to 1F are sectional view showing a method for manufacturing semiconductor devices of a first embodiment in accordance with the present invention.

In manufacturing semiconductor devices by using the manufacturing method according to the first embodiment, a first glass substrate 10 made of quartz glass is firstly prepared as shown in FIG. 1A. Then a metallic film 11 as a film to be worked such as SiN or GaP is formed on a surface of first substrate 10.

Figure 1B:
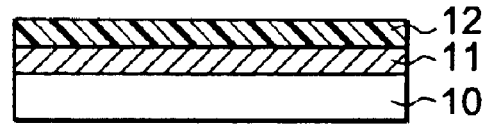

As shown in FIG. 1B, a lower layer resist 12 (PFRIX795G; made by JSR corporation), which is also a film to be worked, is coated with a spin coating. A resist 12 is a non-photosensitive resist layer. In this embodiment, resist 12 has an approximately 280 nm in thickness.

After the coating, resist 12 is heated for about 2 hours at about 190 deg. C. to eliminate photosensitivity of the resist 12 so that a non-photosensitive resist layer is formed.

As is described below, thickness of resist 12 is set to have etching resistibility as a mask when metallic film 11 is etched.

Figure 1C:
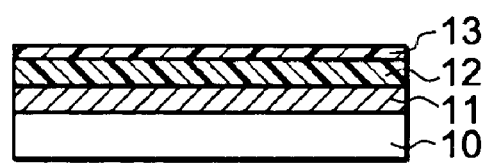

As shown in FIG. 1C, an upper layer resist 13 (Fi-SP2; made by FUJIFILM corporation), whose Si content is about 10%, is coated on the surface of lower layer resist 12 with a spin coating. In the embodiment, upper layer resist 13 has an approximately 130 nm in thickness.

Then, upper layer resist 13 is heated at about 90 deg. C. for about 2 minutes to form a photosensitive resist layer. The base polymer of Fi-SP2, which is a material of upper layer resist 13, is novolac resin including an alkaline-soluble silicon polymer (APSA) and naphtoquinonediazide as a photosensitive body.

Figure 1D:
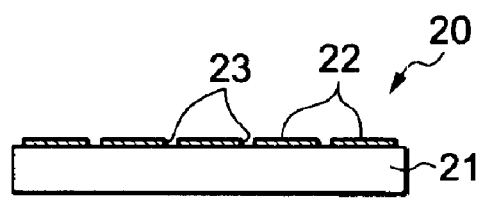

A photomask 20 shown in FIG. 1D is prepared in a step different from the step for forming the photosensitive resist layer. Photomask 20 is used to expose upper layer resist 13, and photomask 20 has a mask substrate 21 as a dielectric substrate made of an approximately 6 mm-thick quartz glass, and a chromium film 22 as a light-shielding film is formed by sputtering in approximately 40 nm thickness.

An opening portion 23 in order to expose upper layer resist 13 is formed in chromium film 22 by a focusing ion beam. The dimension of opening portion 23 is less than the wavelength of the light to expose, which light is emitted from a light source. Hence, the light emitted from the light source cannot pass through opening portion 23. Upper layer resist 13 is not directly exposed to the propagated light. It has been found by the inventor experimentally that the light cannot pass through opening portion 23 when the dimension of opening portion 23 is less than the wavelength of the light.

Opening portion 23 is a lattice-like pattern which has plural 130 nm-width slits 23a in approximately lattice arrangement.

Figure 1E:
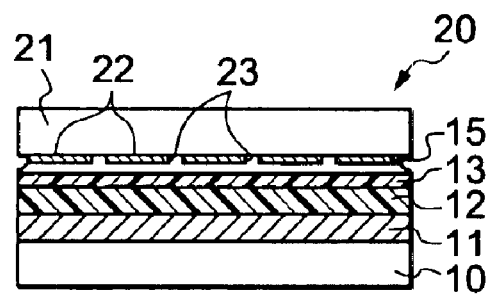

As shown in FIG. 1E, pure water is supplied by an atomizer. The pure water is transparent, inert and non-corroding against metallic film 11, lower layer resist 12, upper layer resist 13, and photomask 20. Thereby, a thin pure-water film 15 is formed on the surface of resist 13. The thickness of pure-water film 15 is set so as to expose resist 13 by near-field light, which will be described below.

In other words, pure-water film 15 is provided between chromium film 22 and the surface of resist 13. A space between photomask 20 and substrate 10 is evacuated by a proximity mask aligner (made by CANNON corporation).

Figure 1F:
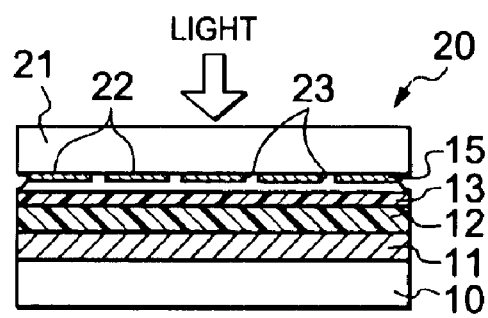
Figure 3:
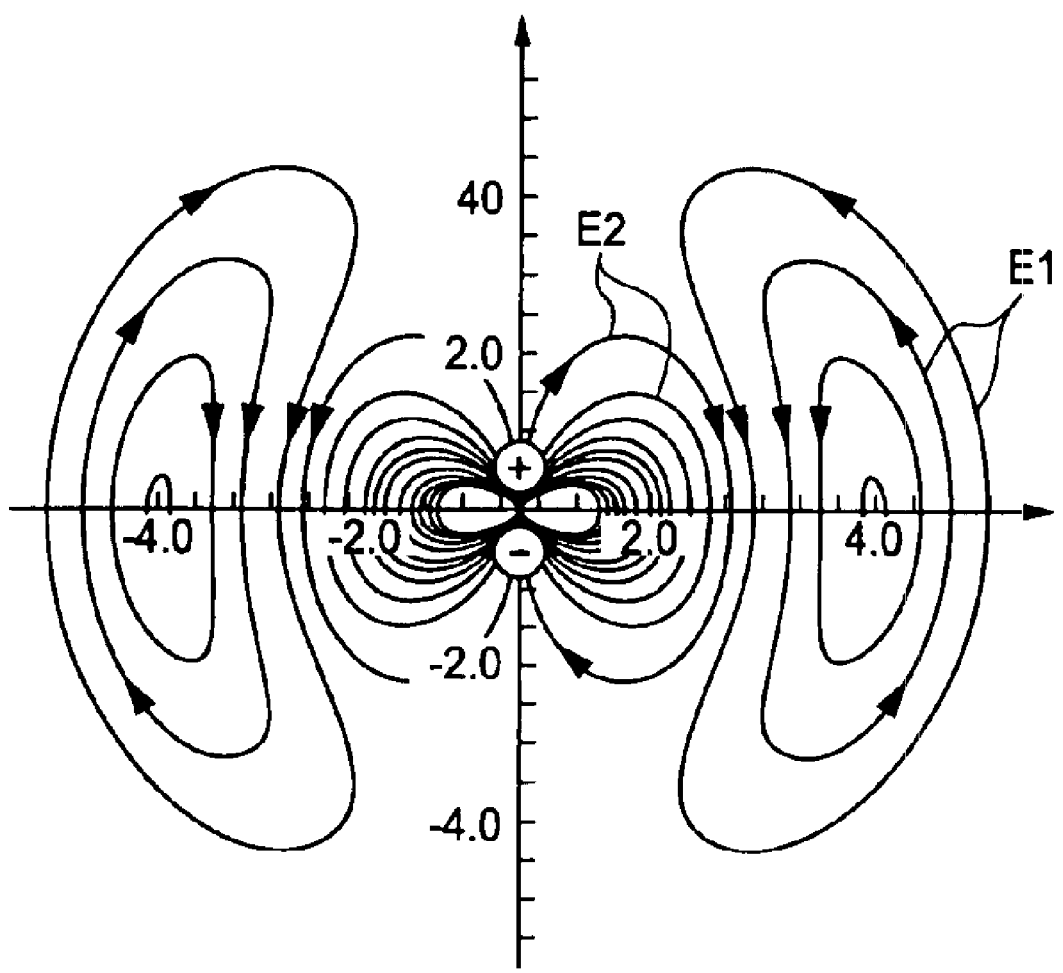
FIG. 3 shows two electric flux lines E1 and E2 generated around a single electric dipole.
Figure 4:
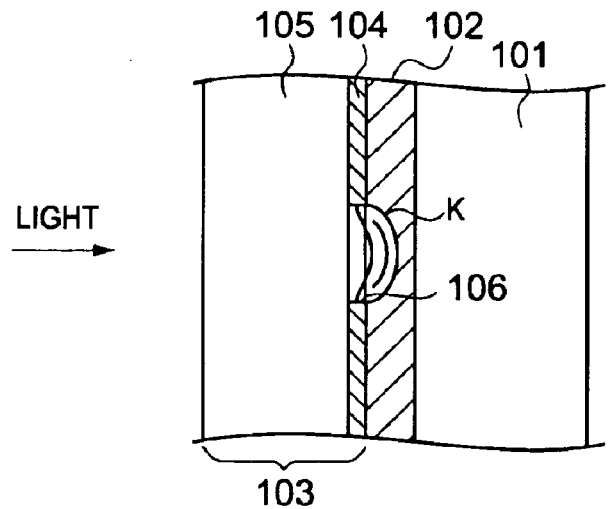
FIG. 4 is an explanatory view to show exposing photosensitive resist layer by the use of near-field light.
Figure 5:
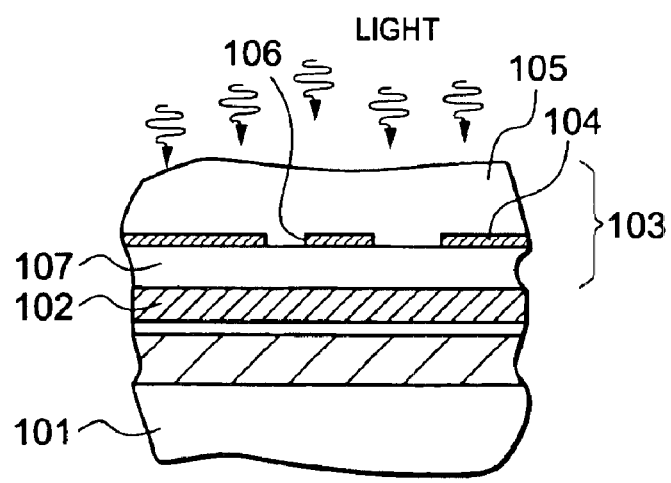
FIG. 5 is a sectional view showing that a solid layer, on which light-shielding film is formed, directly contacts with resist layer 102 formed on a photomask in a prior art.
Figure 6A:
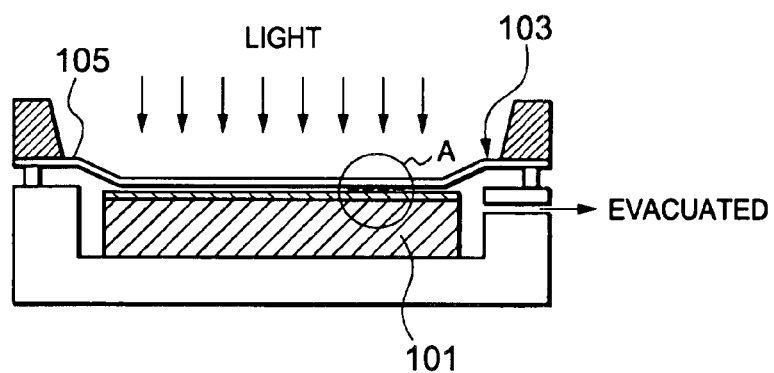
FIGS. 6A and 6B is explanatory views showing that a space between a photomask and a substrate is evacuated to enforce the contact strength between them as a prior art.
Figure 6B:
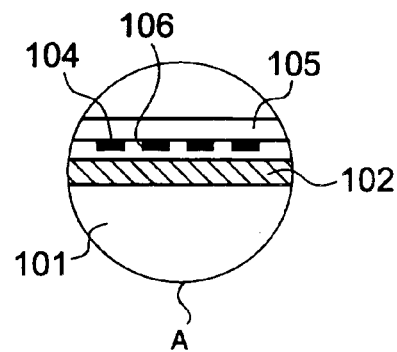

As shown in FIG. 1F, photomask 20 is irradiated with a light of arbitrary wavelength. In this embodiment, a high-pressure mercury lamp irradiates photomask 20 to light having wavelengths of 435 nm, 405 nm and 365 nm for about 100 seconds. Besides, the light is non-polarized natural light. As shown in FIG. 2, when mask substrate 21 is irradiated with light, near-field light K is oozed from opening portion 23 to substrate 10. Then, Photosensitive resist layer is exposed by near-field light oozed from the opening portion through the liquid film layer.

Since near-field light K corresponds to the dimension of opening portion 23, upper layer resist 13 is exposed in the approximately same dimension as opening portion 23.

After the exposing, photo-mask 20 is separated from substrate 10, and upper layer resist 13 is developed with NMD-3, which is a developer, for about 30 seconds. An upper layer mask which has the approximately same pattern as the pattern of photomask 20 is formed on the surface of lower layer resist 12.

First substrate 10 is carried into a reactive chamber of an etching apparatus (not shown). N2 gas and O2 gas are introduced into the reactive chamber at a flow rate of about 94 SCCM and 6 SCCM respectively. The internal pressure is set at about 3 Pa.

Electric power of about 200 W is applied to a stage electrode on which first substrate 10 is set, and lower layer resist 12 is etched through upper layer resist 13 as a mask with RIE (Reactive Ion Etching).

Thereby, on the surface of metallic mask 11, a lower layer mask which has the approximately same pattern as the opening portion 23 is formed. Then, metallic film 11 is fabricated thorough the lower layer mask by such as etching. In other words, metallic film 11 as a film to be worked is fabricated using the photosensitive resist layer as a mask.

A resist pattern formed on the surface of metallic film 11 is fabricated with precision of about 130 nm.

It is possible to work finely without polarizing the light irradiated to photomask 20 by making use of the method for manufacturing semiconductor devices according to the first embodiment, in which embodiment pure water is interposed between substrate 10 and photomask 20.

Thereby, it is inferred that interposing pure water film 15 between substrate 10 and photomask 20 makes it possible to carry out exposure by near-field light without polarizing light.

In the embodiment, upper layer resist 13 is exposed with near-field light oozed from opening portion 23 of chromium film 22.

It is not necessary to use exposure equipments such as steppers. Thus, cost is reduced, and it is possible to work finely without being restricted by a wavelength of a light source.

In the embodiment, upper layer resist 13 is exposed by contacting first substrate 10 with photomask 20.

The method in accordance with the present invention is applicable to large-sized substrates in a meter square such as a mother substrate, which is used in liquid-crystal display.

Further, in the embodiment, pure water film 15 is interposed between upper layer resist 13 and chromium film 22 to contact photomask 20 to substrate 10.

Resist 13 and chromium film 22 are prevented from rubbing each other, and from being damaged.

Instead of pure water, other liquids is applicable, which liquids are transparent, inert and non-corroding against resist 14, substrate 21 and chromium film 22. Glycerin instead of pure water is applicable.

Further, interposing pure water including a surfactant between resist 13 and photomask 20 is applicable in order to provide the pure water smoothly between resist 13 and photomask 20.

A second embodiment according to the present invention is explained with reference to FIGS. 7.

FIGS. 7A to 7F are schedule drawings showing a method for manufacturing semiconductor devices in accordance with the second embodiment.

In the embodiment, second substrate 30 which has flexibility is prepared, and metallic film 31 as worked film such as SiN or GaP is formed on the surface of substrate 30. Papers, plastic films, thin glass substrates are applicable as substrate 30.

Figure 7A:
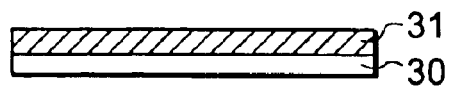
FIGS. 7A to 7H are sectional views showing a method for manufacturing a semiconductor device of a second embodiment in accordance with the present invention.
Figure 7B:
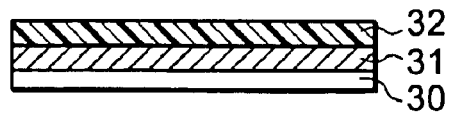

As shown in FIG. 7B, lower layer resist 32 as a film to be worked of non-photosensitive resist layer (made by JSR corporation; PFRIX795G), is coated on the surface of metallic film 31 by a spin coating. The thickness of resist 32 is about 280 nm.

Resist 32 loses its photosensitivity by approximately 2-hour heating of resist 32 at about 190 deg. K. This is a step for forming a non-photosensitive resist layer. The thickness of resist 32 is set to have resistivity as a mask when metallic film 31 is being etched.

Figure 7C:
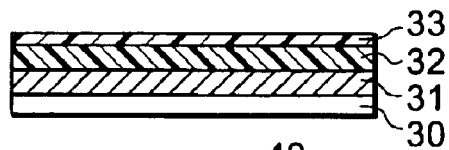

As shown in FIG. 7C, upper layer resist 33 as a photosensitive resist layer (Fi-SP2; made by FUJIFILM corporation), whose Si content is about 10%, is coated on the surface of lower layer resist 32 with a spin coating. In the embodiment, the thickness of resist 33 is about 100 nm. After the coating, resist 33 is heated at about 90 deg. K for about 2 minutes to harden resist 33. By these steps, a photosensitive resist layer pattern is formed.

Two-layer resist 34 of under layer resist 32 and upper layer resist 33 is formed on the surface of metallic film 31. The base polymer of Fi-SP, which is a material of upper layer resist 33, is novolac resin including an alkaline-soluble silicon polymer (APSA) and naphtoquinonediazide as a photosensitive body.

Figure 7D:
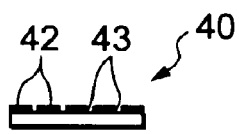

As an another step different from the step for forming resist 34, photomask 40 is prepared to expose upper layer resist 33 as shown in FIG. 7D. Photomask 40 has about 6 mm-thickness mask substrate 41 as a dielectric substrate made of quartz glass and has about 40 nm-thickness tantalum film 42 as a light-shielding film on the surface of the substrate 41. Film 42 has a predetermined pattern formed by sputtering.

Since a planer dimension of photomask 40 is smaller than that of second substrate 30, photomask 40 must be displaced repeatedly on upper layer resist 33 in order to expose resist 33 entirely.

Tantalum film 42 has plural opening portions 43 to expose upper layer resist 33. The portions 43 are formed in a grid pattern by electron beam exposure (EB exposure).

Each opening portion 43 is a planar rectangular, and the planar dimension of each opening portion 43 is arbitrary whether the dimension is larger than the wavelength emitted from a light source or not.

In the embodiment, opening portions 43 are form in grid patterns with 0.32-μm pitch, 0.45-μm pitch and 0.57-μm pitch.

Figure 7E:
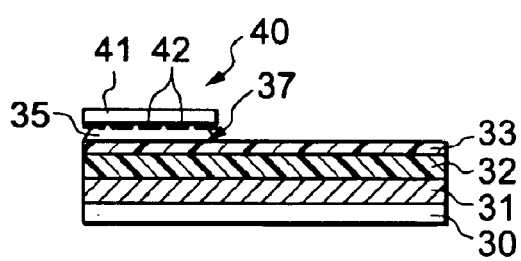

As shown in FIG. 7E, a little amount of a mixture of pure water and glycerin is dropped to a first-exposure area 37 on the surface of second substrate 30. The mixture is non-corroding against upper-layer resist 32, lower-layer resist 33, metallic film 31, and photomask 40, and the mixture is transparent and inert.

Tantalum film 42 of photomask 40 is placed very closely above the surface of resist 33 with the mixture interposed.

In other words, photomask 40 and substrate 30 are bonded so as to fill the space between them with the mixture.

Thereby, liquid film 35 whose thickness is approximately uniform is formed between resist 33 and photomask 40, and the distance between resist 33 and photomask 40 is almost constant entirely.

The preferable mixture ratio between pure water and glycerin depends on the conditions of the exposure.

Figure 7F:
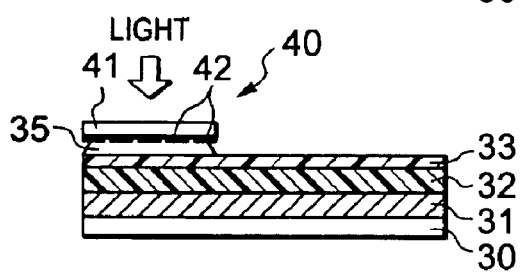

As shown in FIG. 7F, photo mask 40 is irradiated with light. An arbitrary wavelength of the light is applicable. In this embodiment, a high-pressure mercury lamp as a light source irradiates photomask 40 with light having wavelengths of 435 nm, 405 nm and 365 nm for about 25 seconds.

If the dimension of opening portion 43 is smaller than the wavelength of the light to irradiate photomask 40, near-field light is oozed from opening portion 43 to substrate 30. Then, first-exposure area 37 of resist 33 is exposed according to the pattern of photomask 40 as with the first embodiment shown in FIG. 2. The thickness of liquid film 35 is set in order to expose resist 33 by near-field light K.

Since near-field light K corresponds to the dimension of opening portion 43, upper layer resist 33 is exposed in the approximately same dimension as opening portion 43.

When the dimension of opening portion 43 is larger than the wavelength of the light to irradiate photomask 40, propagated light emitted from the high-pressure mercury lamp passes through opening portion 43 and exposes first-exposure area 37 on upper layer resist 33 according to the pattern of photomask 40.

In other words, even if the dimension of some opening portions 43 is larger than the wavelength, it is possible to expose resist 33 with near-field light or propagating light in accordance with its opening portion size, by adjusting the thickness of liquid film 35 interposed between substrate 30 and photo resist 40.

Figure 7G:
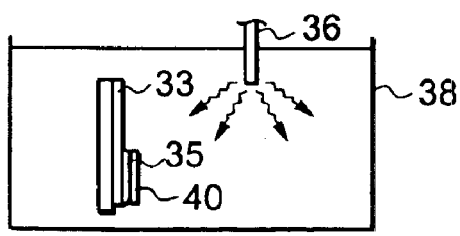

After the exposure of first-exposure area on resist 33, substrate 30 closely contacting with photomask 40 through liquid film 35 is carried into a water tank 38 as shown in FIG. 7G. An ultrasonic vibrator 36 applies ultrasonic vibrations to the water in water tank 38.

The vibration applied to the water propagates liquid film 35, and generates difference in density of water molecules of liquid film 35. This is a step for applying ultrasonic vibrations to the interposed liquid.

Hence, the contact strength between liquid film 35 and substrate 30, and between liquid film 35 and photomask 40 weaken partially. Thus, photomask 40 is easily separated from substrate 30. This is a step for separating the photosensitive resist layer from the photomask while the ultrasonic vibration is applied to the liquid.

Other ways to separate photomask 40 from substrate 30 are applicable instead of applying ultrasonic vibrations to liquid film 35 through the water in water tank 38.

Ultrasonic vibrations may be applied to liquid film 35 through air by arranging ultrasonic vibrator close to liquid film 35. Further, ultrasonic vibrations may be directly applied to liquid film 35 by contacting ultrasonic vibrator with photomask 40 or substrate 30.

Cavitations may occur inside liquid film 35 under certain frequencies of the ultrasonic vibrations or certain ways to apply the ultrasonic vibration. Thus, the contact strength is likely to weaken, and it may be easier to separate photomask 40 from substrate 30.

Heating liquid film 35 by a heater is also applicable in order to vaporize at least a part of the liquid and in order to weaken the contact strength. This is a step for vaporizing at least a part of the liquid by heating the liquid.

After the step for heating liquid film 35, the step for separating photomask 40 from substrate 30 is carried out.

An infrared ray lamp whose light is easily absorbed by pure water is preferable as the heater when liquid film 35 is pure water film.

Figure 7H:
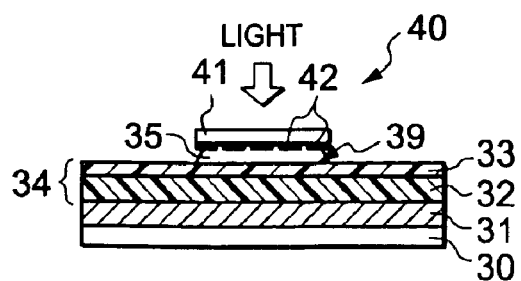

After the exposure of first-exposure area 37 photomask 40 is displaced to a second-exposure area 39 as shown in FIG. 7H, which area 39 is not yet exposed. Then, exposing second-exposure area 39 is carried out. Finally, the entire surface of resist 33 is exposed by cyclically repeating the exposures.

After the exposures of resist 33, photomask 20 is separated from substrate 30, then resist 33 is developed with NMD-3 as a developer for about 20 seconds. Finally, upper layer mask having the same pattern of the opening portion is formed. This is a step for patterning photosensitive resist layer. In the second embodiment, post-bake (PEB) for the upper layer mask is not necessary after the development.

Second substrate 30 is carried into a reactive chamber of a parallel flat plate type RIE apparatus (not shown). N2 gas and O2 gas are introduced into the reactive chamber at a flow rate of about 94 SCCM and 6 SCCM respectively. The internal pressure is set at about 3 Pa.

RF power of about 200 W and 13.56 MHz is applied to a stage electrode on which substrate 30 is set. Lower layer resist 32 is etched through the upper layer mask 33.

Thereby, lower layer mask 32 having the same pattern as the upper layer mask 33, in other words, the same pattern as opening portion is formed on the surface of metallic film 31. Metallic film 31 is etched through the lower layer mask.

A resist pattern having the same pattern as the pattern of the first embodiment is formed on metallic film 31. A resist pattern with 320-nm pitch has been fabricated according to the second embodiment.

Flexible materials such as papers, plastic films, or thin glass substrates may be used as second substrate 30 according to a method of exposure and manufacturing semiconductor devices of the second embodiment.

When such materials are used, substrate 30 is likely to bend or warp in an exposure process.

But, it is possible to expose substrate 30 with high accuracy because interposing liquid film 35 between photomask 40 and substrate 30 makes it possible to maintain the distance between photomask 40 and substrate 30 constant even if substrate 30 has flexibility.

A thin glass substrate with large area is used for a flat panel display such as a liquid-crystal display with recent enlargement of the screen of the flat panel display. Such a thin glass substrate with large area easily bents or warps. But, the present invention is effective to manufacture a flat panel display which has a large screen of a thin glass substrate.

Further, it is possible to manufacture IC chips or picture elements finely on a flexible substrate such as an electronic paper.

It is further possible to separate photomask 40 from substrate 30 easily and fast by applying ultrasonic vibration or heat to liquid film 35 interposed between substrate 30 and photomask 40.

If a planer dimension of photomask 40 is smaller than that of substrate 30, several times of displacement of photomask 40 and repeating partial batch exposure after the each displacement is necessary to expose the entire surface of substrate 30. But it is possible to shorten a time for the each separation by the use of the method to separate photomask 40 and substrate 30 according to the second embodiment. Consequently, productivity increases.

What is claimed is:

1. A method for exposing a photosensitive resist layer with near-field light, comprising;
   providing a liquid film layer between the photosensitive resist layer and a photomask, the photomask having a light-shielding film containing an opening portion whose dimension is smaller than the wavelength of light emitted from a light source; and
   exposing the photosensitive resist layer with near-field light through the opening portion and the liquid film layer.

2. A method for exposing a photosensitive resist layer with near-field light, comprising;
   providing a liquid film layer between the photosensitive resist layer and a photomask, the photomask having a light-shielding film containing an opening portion through which a propagated light emitted from a light source cannot pass; and
   exposing the photosensitive resist layer with near-field light through the opening portion and the liquid film layer.

3. A method for exposing a photosensitive resist layer with near-field light, according to claim 1, wherein the liquid film layer is non-corroding against the photosensitive resist layer and the photomask.

4. A method for exposing a photosensitive resist layer with near-field light, according to claim 2, wherein the liquid film layer is non-corroding against the photosensitive resist layer and the photomask.

5. A method for exposing a photosensitive resist layer with near-field light, according to claim 1, wherein the liquid film layer is transparent.

6. A method for exposing a photosensitive resist layer with near-field light, according to claim 2, wherein the liquid film layer is transparent.

7. A method for exposing a photosensitive resist layer with near-field light, according to claim 1, wherein the liquid film layer is inert.

8. A method for exposing a photosensitive resist layer with near-field light, according to claim 2, wherein the liquid film layer is inert.

9. A method for exposing a photosensitive resist layer with near-field light, according to claim 1, wherein the liquid film layer includes at least one of pure water and glycerin.

10. A method for exposing a photosensitive resist layer with near-field light, according to claim 2, wherein the liquid film layer includes at least one of pure water and glycerin.

11. A method for exposing a photosensitive resist layer with near-field light, according to claim 1, wherein the liquid film layer is pure water including surfactant.

12. A method for exposing a photosensitive resist layer with near-field light, according to claim 2, wherein the liquid film layer is pure water including surfactant.

13. A method for manufacturing a semiconductor device, comprising;
    forming a photosensitive resist layer on a surface of a first film;
    providing a liquid film layer between the photosensitive resist layer and a photomask, the photomask having a light-shielding film containing an opening portion whose dimension is smaller than the wavelength of light emitted from a light source;
    exposing the photosensitive resist layer with near-field light through the opening portion and the liquid film layer,
    forming the photosensitive resist layer into a pattern using the photomask; and
    fabricating the first film using the photosensitive resist layer as a mask.

14. A method for manufacturing a semiconductor device, comprising;
    forming a photosensitive resist layer on a surface of a first film;
    providing a liquid film layer between the photosensitive resist layer and a photomask, the photomask having a light-shielding film containing an opening portion through which a propagated light emitted from a light source cannot pass;
    exposing the photosensitive resist layer with near-field light through the opening portion and the liquid film layer;
    forming the photosensitive resist layer with the pattern using the photomask; and
    fabricating the first film using the photosensitive resist layer as a mask.

15. A method for manufacturing a semiconductor device, according to claim 13, wherein the liquid film layer is non-corroding against the photosensitive resist layer and the photomask.

16. A method for manufacturing a semiconductor device, according to claim 14, wherein the liquid film layer is non-corroding against the photosensitive resist layer and the photomask.

17. A method for manufacturing a semiconductor device, according to claim 13, wherein the liquid film layer is transparent.

18. A method for manufacturing a semiconductor device, according to claim 14, wherein the liquid film layer is transparent.

19. A method for manufacturing a semiconductor device, according to claim 13, wherein the liquid film layer is inert.

20. A method for manufacturing a semiconductor device, according to claim 14, wherein the liquid film layer is inert.

21. A method for manufacturing a semiconductor device, according to claim 13, wherein the liquid film layer includes at least one of pure water and glycerin.

22. A method for manufacturing a semiconductor device, according to claim 14, wherein the liquid film layer includes at least one of pure water and glycerin.

23. A method for manufacturing a semiconductor device, according to claim 13, wherein the liquid film layer is pure water including surfactant.

24. A method for manufacturing a semiconductor device, according to claim 14, wherein the liquid film layer is pure water including surfactant.

25. A method for manufacturing a semiconductor devices according to claim 13, further comprising separating the photosensitive resist layer from the photomask while ultrasonic vibrations are applied to the liquid film layer.

26. A method for manufacturing a semiconductor device, according to claim 14, further comprising separating the photosensitive resist layer from the photomask while the ultrasonic vibrations are applied to the liquid film layer.

27. A method for manufacturing a semiconductor device, according to claim 13, further comprising separating the photosensitive resist layer from the photomask while the liquid film layer is heated.

28. A method for manufacturing a semiconductor device, according to claim 14, further comprising separating the photosensitive resist layer from the photomask while the liquid film layer is heated.

* * * * *